United States Patent
Chen et al.

(10) Patent No.: US 12,279,460 B2
(45) Date of Patent: Apr. 15, 2025

(54) ELECTROSTATIC DISCHARGE PROTECTION DEVICE

(71) Applicant: Powerchip Semiconductor Manufacturing Corporation, Hsinchu (TW)

(72) Inventors: Ming-Hui Chen, Hsinchu (TW); Chih-Feng Lin, Taipei (TW); Chiu-Tsung Huang, Hsinchu (TW); Hsiang-Hung Chang, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 444 days.

(21) Appl. No.: 17/884,533

(22) Filed: Aug. 9, 2022

(65) Prior Publication Data

US 2023/0411382 A1 Dec. 21, 2023

(30) Foreign Application Priority Data

Jun. 8, 2022 (TW) .................................. 111121229

(51) Int. Cl.
H10D 89/60 (2025.01)
(52) U.S. Cl.
CPC .................................. H10D 89/811 (2025.01)
(58) Field of Classification Search
CPC ............... H02H 9/046; H01L 29/1083; H01L 29/66681; H01L 29/063; H01L 27/0266; H10D 89/811
See application file for complete search history.

(56) References Cited

U.S. PATENT DOCUMENTS 6,514,839 B1   2/2003   Ker et al.
6,998,685 B2   2/2006   Manna et al.
(Continued)

FOREIGN PATENT DOCUMENTS

CN   106887452   6/2017
EP   3142150      3/2017
WO   2010110904  9/2010

OTHER PUBLICATIONS

"Notice of allowance of Taiwan Counterpart Application", issued on May 24, 2023, p. 1-p. 4.

*Primary Examiner* — Andres Munoz
*Assistant Examiner* — Aaron Michael Wegner
(74) *Attorney, Agent, or Firm* — JCIPRNET

(57) ABSTRACT

An electrostatic discharge (ESD) protection device including the following components is provided. A first transistor includes a first gate, a first N-type source region, and an N-type drain region. A second transistor includes a second gate, a second N-type source region, and the N-type drain region. The N-type drain region is located between the first gate and the second gate. An N-type drift region is located in a P-type substrate between the first gate and the second gate and is located directly below a portion of the first gate and directly below a portion of the second gate. The N-type drain region is located in the N-type drift region. A P-type barrier region is located in the P-type substrate below the N-type drift region. The P-type barrier region has an overlapping portion overlapping the N-type drift region. There is at least one first opening in the overlapping portion.

17 Claims, 5 Drawing Sheets

(56) References Cited

U.S. PATENT DOCUMENTS

| | | | | |
|---|---|---|---|---|
| 7,667,268 B2* | 2/2010 | Disney | ............... | H01L 29/7809 |
| | | | | 257/E29.256 |
| 7,709,896 B2 | 5/2010 | Russ et al. | | |
| 2006/0268477 A1* | 11/2006 | Camp | ................ | H01L 27/0262 |
| | | | | 361/56 |
| 2013/0270606 A1* | 10/2013 | Chen | .................. | H01L 29/0626 |
| | | | | 257/E21.409 |

* cited by examiner

ELECTROSTATIC DISCHARGE PROTECTION DEVICE

CROSS-REFERENCE TO RELATED APPLICATION

This application claims the priority benefit of Taiwan application serial no. 111121229, filed on Jun. 8, 2022. The entirety of the above-mentioned patent application is hereby incorporated by reference herein and made a part of this specification.

BACKGROUND

Technical Field

The invention relates to a semiconductor device, and particularly relates to an electrostatic discharge (ESD) protection device.

Description of Related Art

Currently, a metal oxide semiconductor (MOS) transistor device with a P-type barrier region has been developed, thereby increasing the breakdown voltage of the MOS transistor device. However, since the P-type barrier region will cause the current crowding effect, the MOS transistor device is prone to hard breakdown (HBD) when used as an ESD protection device.

SUMMARY

The invention provides an ESD protection device, which can prevent the current crowding effect, thereby improving the protection capability of the ESD protection device.

The invention provides an ESD protection device, which includes a P-type substrate, a first transistor, a second transistor, an N-type drift region, and a P-type barrier region. The first transistor includes a first gate, a first N-type source region, and an N-type drain region. The first gate is located on the P-type substrate. The first N-type source region and the N-type drain region are located in the P-type substrate on two sides of the first gate. The second transistor includes a second gate, a second N-type source region, and the N-type drain region. The second gate is located on the P-type substrate. The second N-type source region and the N-type drain region are located in the P-type substrate on two sides of the second gate. The N-type drain region is located between the first gate and the second gate. The N-type drift region is located in the P-type substrate between the first gate and the second gate and is located directly below a portion of the first gate and directly below a portion of the second gate. The N-type drain region is located in the N-type drift region. The P-type barrier region is located in the P-type substrate below the N-type drift region. The P-type barrier region has an overlapping portion overlapping the N-type drift region. There is at least one first opening in the overlapping portion.

According to an embodiment of the invention, in the ESD protection device, the first transistor may be a grounded-gate N-type metal oxide semiconductor (GGNMOS) transistor.

According to an embodiment of the invention, in the ESD protection device, the second transistor may be a GGNMOS transistor.

According to an embodiment of the invention, in the ESD protection device, the first transistor and the second transistor may share the N-type drain region.

According to an embodiment of the invention, in the ESD protection device, the components in the first transistor and the components in the second transistor may have a symmetrical configuration relationship.

According to an embodiment of the invention, in the ESD protection device, the overlapping portion may extend into the N-type drift region.

According to an embodiment of the invention, in the ESD protection device, the open ratio of the overlapping portion may be 40% to 80%.

According to an embodiment of the invention, in the ESD protection device, the open ratio of the overlapping portion may be 40% to 70%.

According to an embodiment of the invention, in the ESD protection device, the open ratio of the overlapping portion may be 59% to 69%.

According to an embodiment of the invention, in the ESD protection device, the width of the overlapping portion may be smaller than the width of the N-type drift region.

According to an embodiment of the invention, in the ESD protection device, the first transistor may further include a gate dielectric layer. The gate dielectric layer is located between the first gate and the P-type substrate.

According to an embodiment of the invention, in the ESD protection device, the second transistor may further include a gate dielectric layer. The gate dielectric layer is located between the second gate and the P-type substrate.

According to an embodiment of the invention, in the ESD protection device, the first transistor may further include a first P-type body region and a first P-type bulk region. The first P-type body region is located in the P-type substrate. The first P-type body region and the first N-type source region may be located on the same side of the first gate. The first N-type source region may be located in the first P-type body region. The first P-type bulk region is located in the first P-type body region. The first N-type source region may be located between the first P-type bulk region and the first gate.

According to an embodiment of the invention, in the ESD protection device, the second transistor may further include a second P-type body region and a second P-type bulk region. The second P-type body region is located in the P-type substrate. The second P-type body region and the second N-type source region may be located on the same side of the second gate. The second N-type source region may be located in the second P-type body region. The second P-type bulk region is located in the second P-type body region. The second N-type source region may be located between the second P-type bulk region and the second gate.

According to an embodiment of the invention, in the ESD protection device, there may be a second opening and a third opening in the P-type barrier region. The second opening may be located directly below the first P-type body region. The third opening may be located directly below the second P-type body region.

According to an embodiment of the invention, the ESD protection device may further include a deep N-type well (DNW) region. The DNW region is located in the P-type substrate below the N-type drift region, the P-type barrier region, the first transistor, and the second transistor.

According to an embodiment of the invention, in the ESD protection device, the overlapping portion may extend into the deep N-well region.

According to an embodiment of the invention, in the ESD protection device, the DNW region may be connected to the N-type drift region.

According to an embodiment of the invention, the ESD protection device may further include an isolation structure. The isolation structure is located in the P-type substrate and may define an active region.

According to an embodiment of the invention, in the ESD protection device, the bottom view pattern of the P-type barrier region may surround the bottom view pattern of the active region.

Based on the above description, in the ESD protection device according to the invention, the N-type drain region is located in the N-type drift region, the P-type barrier region is located in the P-type substrate below the N-type drift region, the P-type barrier region has the overlapping portion overlapping the N-type drift region, and there is at least one first opening in the overlapping portion. Therefore, the first opening in the overlapping portion can increase the ESD current path and can improve the uniformity of the ESD current, thereby preventing the current crowding effect. In this way, the ESD robustness of the ESD protection device can be improved, and the hard breakdown (HBD) of the ESD protection device can be delayed. In addition, the ESD protection device according to the invention does not cause an increase in area. On the other hand, since the manufacturing process of the ESD protection device according to the invention does not require the extra mask and the extra ion implantation process, the difficulty of the manufacturing process is low and the manufacturing cost can be reduced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
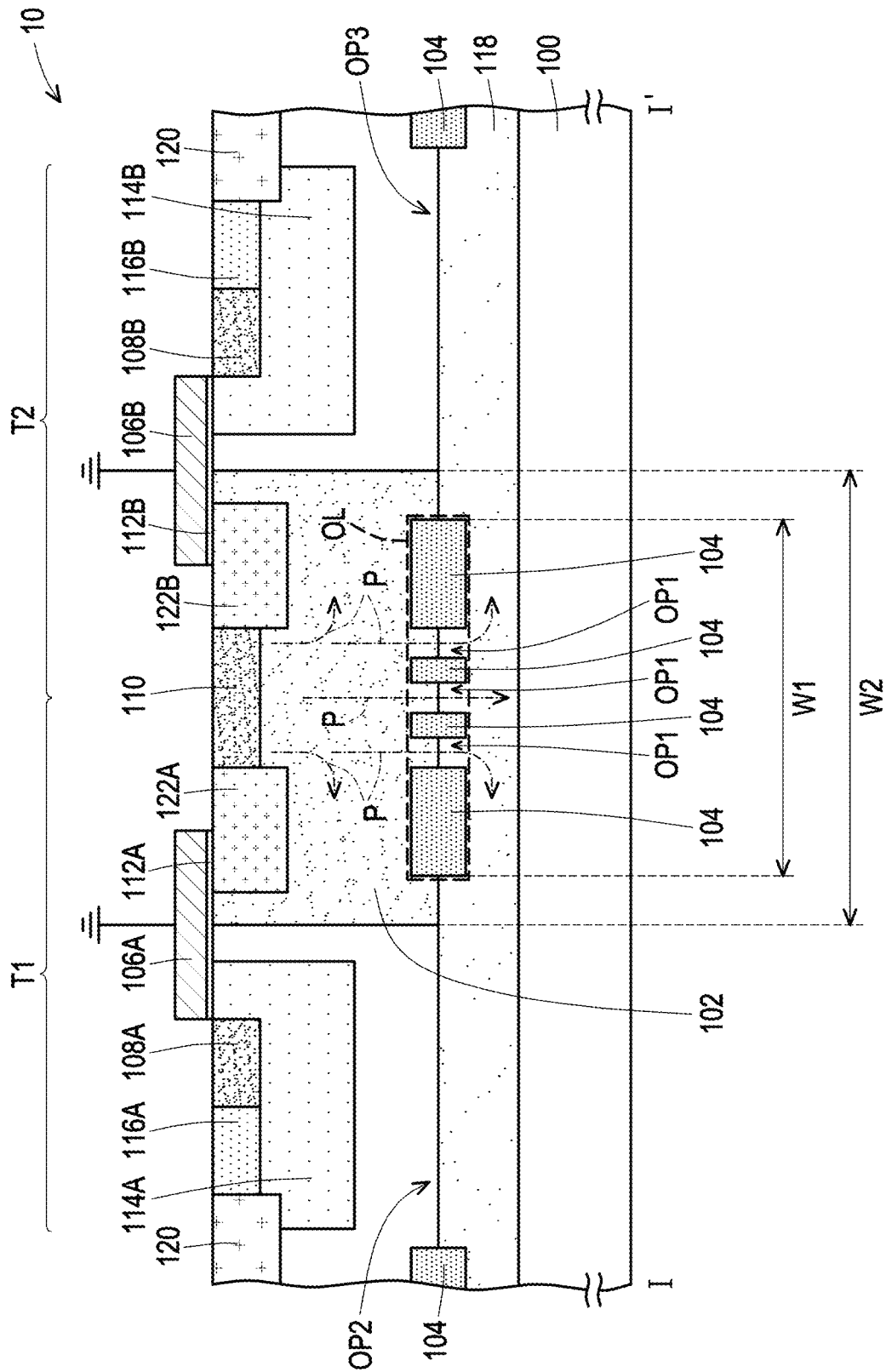
FIG. 1 is a cross-sectional view illustrating an ESD protection device according to some embodiments of the invention.
Figure 2:
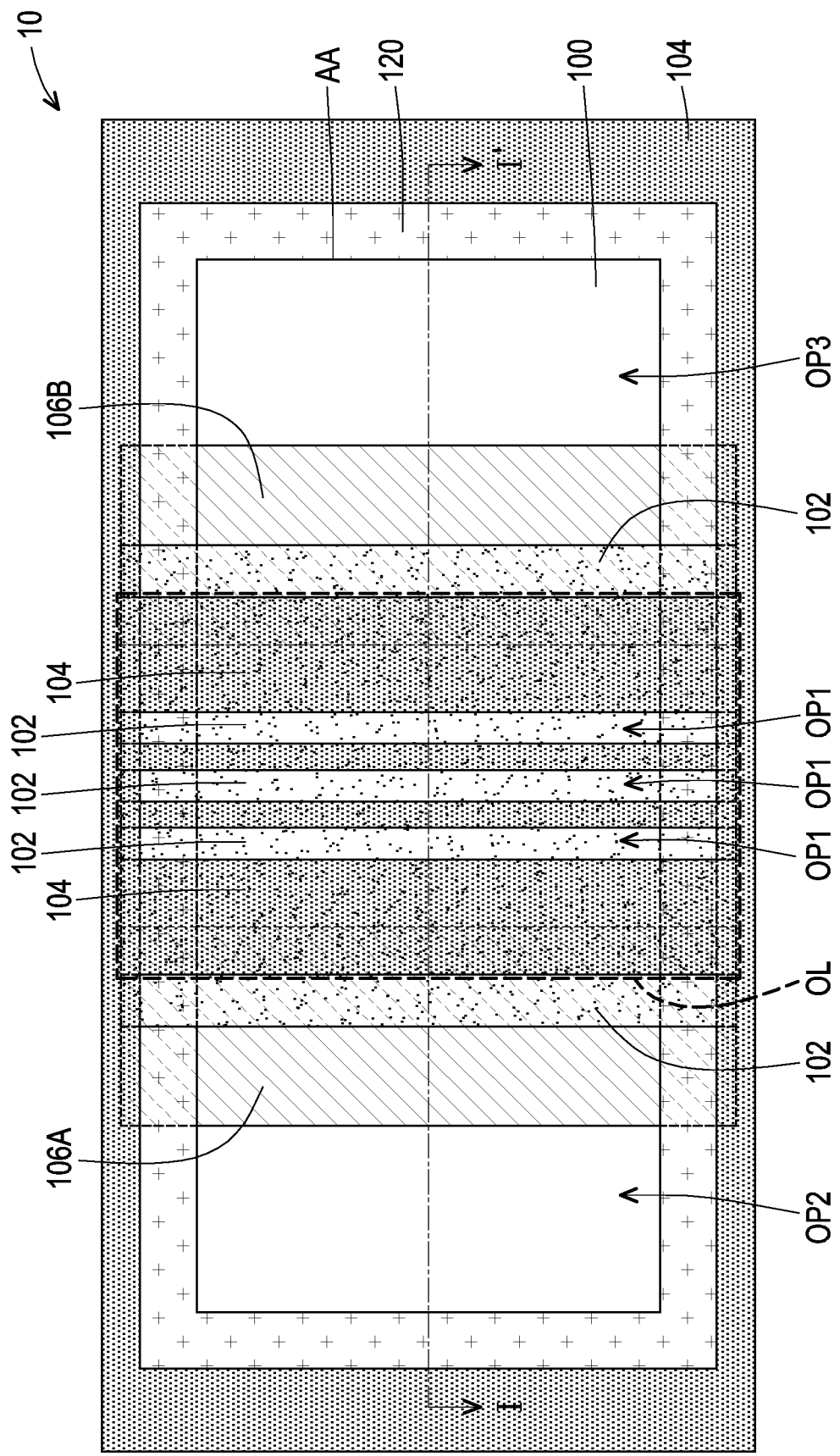
FIG. 2 is a bottom view of FIG. 1.
Figure 3B:
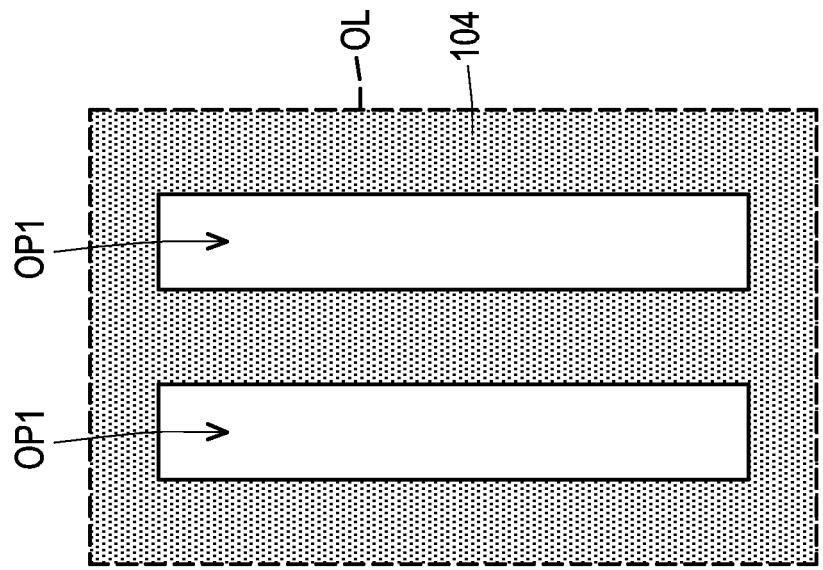
FIG. 3A to FIG. 3E are bottom views of overlapping portions according to some embodiments of the invention.
Figure 3A:
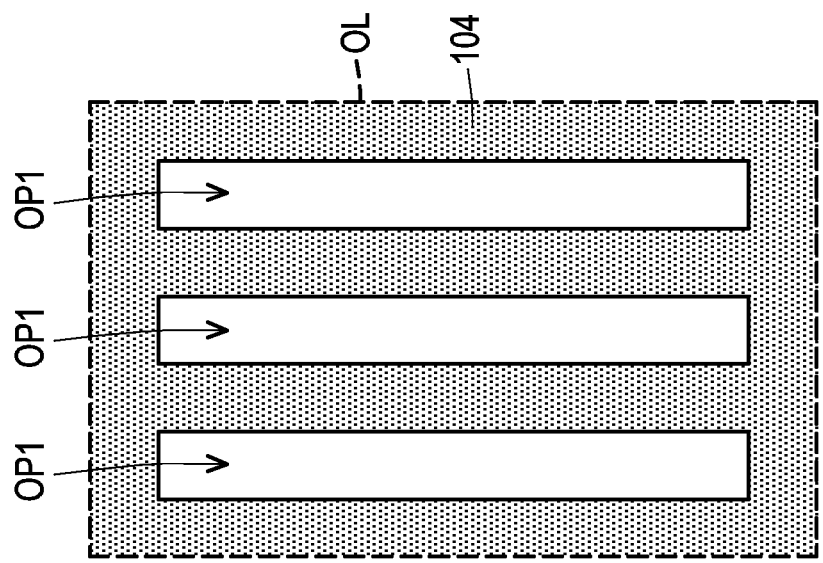
Figure 3D:
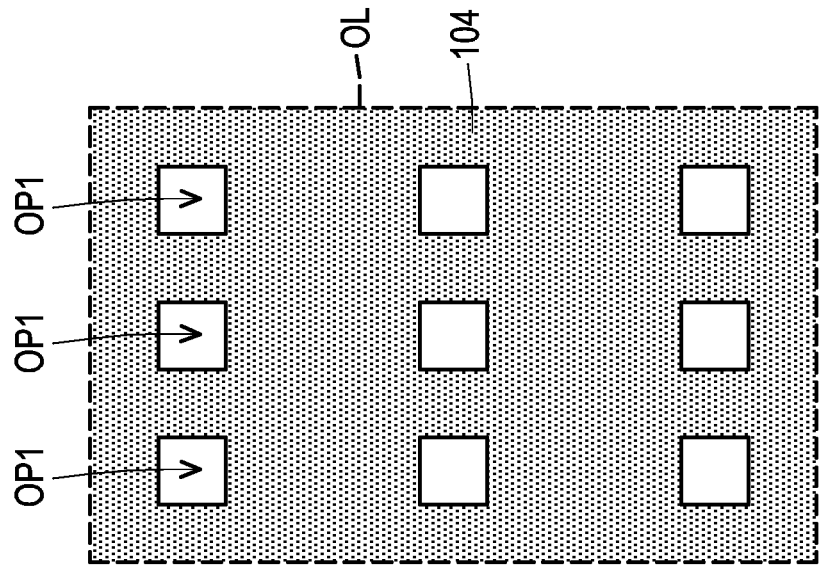
Figure 3C:
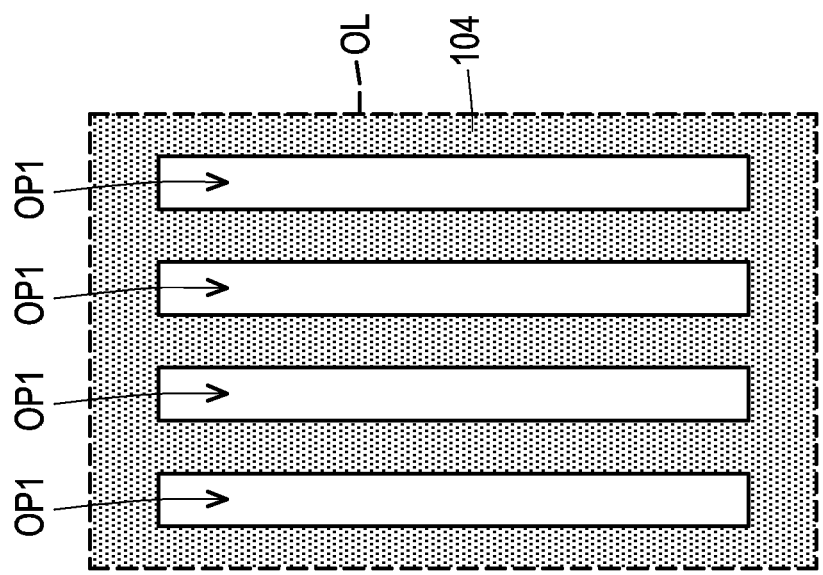
Figure 3E:
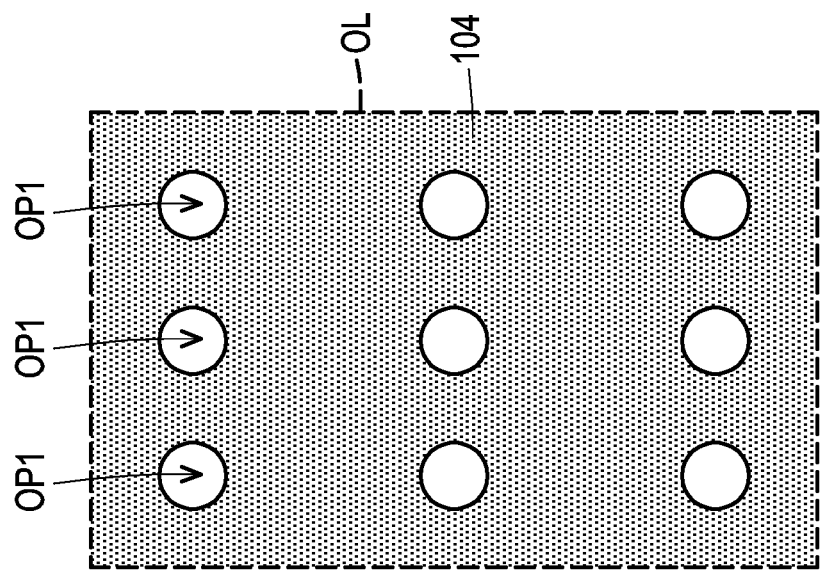

FIG. 1 is a cross-sectional view illustrating an ESD protection device according to some embodiments of the invention. FIG. 2 is a bottom view of FIG. 1. FIG. 1 is the cross-sectional view taken along a section line I-I' in FIG. 2. In the bottom view of the present embodiment, some components in the cross-sectional view are omitted to clearly illustrate the configuration relationship between the components in the bottom view. FIG. 3A to FIG. 3E are bottom views of overlapping portions according to some embodiments of the invention.

Referring to FIG. 1 and FIG. 2, an ESD protection device 10 includes a P-type substrate 100, a transistor T1, a transistor T2, an N-type drift region 102, and a P-type barrier region 104. The P-type substrate 100 may be a P-type semiconductor substrate such as a P-type silicon substrate.

The transistor T1 includes a gate 106A, an N-type source region 108A, and an N-type drain region 110. The transistor T1 may be a GGNMOS transistor. The gate 106A is located on the P-type substrate 100. The material of the gate 106A is, for example, doped polysilicon. The N-type source region 108A and the N-type drain region 110 are located in the P-type substrate 100 on two sides of the gate 106A.

The transistor T1 may further include at least one of a gate dielectric layer 112A, a P-type body region 114A, and a P-type bulk region 116A. The gate dielectric layer 112A is located between the gate 106A and the P-type substrate 100. The material of the gate dielectric layer 112A is, for example, silicon oxide. The P-type body region 114A is located in the P-type substrate 100. The P-type body region 114A and the N-type source region 108A may be located on the same side of the gate 106A. In some embodiments, the body region 114A may be located directly below a portion of the gate 106A. The N-type source region 108A may be located in P-type body region 114A. The P-type bulk region 116A is located in the P-type body region 114A. The N-type source region 108A may be located between the P-type bulk region 116A and the gate 106A. In the present embodiment, the N-type source region 108A and the P-type bulk region 116A may be connected to each other, but the invention is not limited thereto. In other embodiments, the N-type source region 108A and the P-type bulk region 116A may be separated from each other.

The transistor T2 includes a gate 106B, an N-type source region 108B, and the N-type drain region 110. The transistor T2 may be a GGNMOS transistor. The gate 106B is located on the P-type substrate 100. The material of the gate 106B is, for example, doped polysilicon. The N-type source region 108B and the N-type drain region 110 are located in the P-type substrate 100 on two sides of the gate 106B.

The transistor T2 may further include at least one of a gate dielectric layer 112B, a P-type body region 114B, and a P-type bulk region 116B. The gate dielectric layer 112B is located between the gate 106B and the P-type substrate 100. The material of the gate dielectric layer 112B is, for example, silicon oxide. The P-type body region 114B is located in the P-type substrate 100. The P-type body region 114B and the N-type source region 108B may be located on the same side of the gate 106B. In some embodiments, the body region 114B may be located directly below a portion of the gate 106B. The N-type source region 108B may be located in the P-type body region 114B. The P-type bulk region 116B is located in P-type body region 114B. The N-type source region 108B may be located between the P-type bulk region 116B and the gate 106B. In the present embodiment, the N-type source region 108B and the P-type bulk region 116B may be connected to each other, but the invention is not limited thereto. In other embodiments, the N-type source region 108B and the P-type bulk region 116B may be separated from each other.

In addition, the N-type drain region 110 is located between the gate 106A and the gate 106B. In some embodiments, there may be a required salicide blocking (SAB) layer (not shown) over the N-type drain region 110, and the SAB layer may expose a portion of the N-type drain region 110 to facilitate the formation of the metal silicide layer (not shown) on the portion N-type drain region 110. In some embodiments, the transistor T1 and the transistor T2 may share the N-type drain region 110. In some embodiments, the components in transistor T1 and the components in transistor T2 may have a symmetrical configuration relationship.

In some embodiments, the transistor T1 and the transistor T2 may be connected in parallel. In some embodiments, when the transistor T1 is the GGNMOS transistor, the gate 106A, the N-type source region 108A, and the P-type bulk region 116A in the transistor T1 may be electrically connected to each other by an interconnect structure (not shown). In some embodiments, when the transistor T2 is a GGNMOS transistor, the gate 106B, the N-type source region 108B, and the P-type bulk region 116B in the transistor T2 may be electrically connected to each other by an interconnect structure (not shown). In some embodiments, when the transistor T1 and the transistor T2 are GGNMOS transistors, the gate 106A, the N-type source region 108A, and the P-type bulk region 116A in the transistor T1 and the gate 106B, the N-type source region 108B, and the P-type bulk region 116B in the transistor T2 may be electrically connected to each other by an interconnect structure (not shown).

The N-type drift region 102 is located in the P-type substrate 100 between the gate 106A and the gate 106B and is located directly below a portion of the gate 106A and directly below a portion of the gate 106B. The N-type drain region 110 is located in the N-type drift region 102.

The P-type barrier region 104 is located in the P-type substrate 100 below the N-type drift region 102. The P-type barrier region 104 has an overlapping portion OL overlapping the N-type drift region 102. In some embodiments, the overlapping portion OL may extend into the N-type drift region 102. In some embodiments, the width W1 of the overlapping portion OL may be smaller than the width W2 of the N-type drift region 102.

Furthermore, there is at least one opening OP1 in the overlapping portion OL. Therefore, the ESD current path P (FIG. 1) can be increased, thereby preventing the current crowding effect. In this way, the ESD robustness of the ESD protection device 10 can be improved, and the hard breakdown of the ESD protection device can be prevented. In the present embodiment, the number of the openings OP1 is, for example, multiple, but the invention is not limited thereto. As long as the number of the openings OP1 is at least one, it falls within the scope of the invention.

In some embodiments, the open ratio of the overlapping portion OL may be 40% to 80%, so that the ESD protection device 10 can have better ESD robustness. When the open ratio of the overlapping portion OL is 40% to 80%, the breakdown voltage of the ESD protection device 10 can be prevented from being decreased. In addition, when the open ratio of the overlapping portion OL is greater than 80%, the breakdown voltage of the ESD protection device 10 decreases. In some embodiments, the open ratio of the overlapping portion OL may be 40% to 70%, so that the ESD protection device 10 can have better ESD robustness. In some embodiments, the open ratio of the overlapping portion OL may be 59% to 69%, so that the ESD protection device 10 can have optimized ESD robustness. In the present embodiment, as shown in formula 1 below, the open ratio is the bottom view area of the opening OP1 divided by the bottom view area of the overlapping portion OL, the bottom view area of the overlapping portion OL is the sum of the bottom view area of the P-type barrier region 104 of the overlapping portion OL and the bottom view area of the opening OP1.

$$\text{the open ratio} = \frac{\text{the bottom view area of the opening } OP1}{\text{the bottom view area of the overlapping portion } OL} \quad \text{[Formula 1]}$$

In some embodiments, as shown in FIG. 2 and FIG. 3A to FIG. 3E, the bottom view pattern of the overlapping portion OL may include a fence shape or a lattice shape. In some embodiments, the bottom view pattern of the opening OP1 may be a rectangle (FIG. 2 and FIG. 3A to FIG. 3D), a circle (FIG. 3E), other polygons, an irregular shape, or a combination thereof. In some embodiments, the arrangement of the openings OP1 may be a matrix arrangement (FIG. 2 and FIG. 3A to FIG. 3E) or an irregular arrangement.

In some embodiments, there may be an opening OP2 and an opening OP3 in the P-type barrier region 104. The opening OP2 may be located directly below the P-type body region 114A. The opening OP3 may be located directly below the P-type body region 114B.

The ESD protection device 10 may further include a DNW region 118. The DNW region 118 is located in the P-type substrate 100 below the N-type drift region 102, the P-type barrier region 104, the transistor T1, and the transistor T2. In some embodiments, the overlapping portion OL may extend into the DNW region 118. In some embodiments, the DNW region 118 may be connected to the N-type drift region 102.

The ESD protection device 10 may further include at least one of an isolation structure 120, an isolation structure 122A, and an isolation structure 122B. The isolation structure 120 is located in the P-type substrate 100 and may define an active region AA (FIG. 2). In some embodiments, the bottom view pattern of the P-type barrier region 104 may surround the bottom view pattern of the active region AA. In some embodiments, a portion of the P-type barrier region 104 may be located in the P-type substrate 100 below the isolation structure 120. The isolation structure 120 is, for example, a shallow trench isolation (STI) structure. The material of the isolation structure 120 is, for example, silicon oxide.

The isolation structure 122A is located in the P-type substrate 100 between the gate 106A and the N-type drain region 110 and is located directly below a portion of the gate 106A. In some embodiments, the isolation structure 122A may be located in the N-type drift region 102. The isolation structure 122A is, for example, a shallow trench isolation structure. The material of the isolation structure 122A is, for example, silicon oxide.

The isolation structure 122B is located in the P-type substrate 100 between the gate 106B and the N-type drain region 110 and is located directly below a portion of the gate 106B. In some embodiments, the isolation structure 122B may be located in the N-type drift region 102. The isolation structure 122B is, for example, a shallow trench isolation structure. The material of the isolation structure 122B is, for example, silicon oxide.

Based on the above embodiments, in the ESD protection device 10, the N-type drain region 110 is located in the N-type drift region 102, the P-type barrier region 104 is located in the P-type substrate 100 below the N-type drift region 102, the P-type barrier region 104 has an overlapping portion OL overlapping the N-type drift region 102, and there is at least one opening OP1 in the overlapping portion OL. Therefore, the opening OP1 in the overlapping portion OL can increase the ESD current path P (FIG. 1) and can improve the uniformity of the ESD current, thereby preventing the current crowding effect. In this way, the ESD robustness of the ESD protection device 10 can be improved, and the hard breakdown of the ESD protection device 10 can be delayed. In addition, the ESD protection device 10 does not cause an increase in area. On the other hand, since the manufacturing process of the ESD protection device 10 does not require the extra mask and the extra ion implantation process, the difficulty of the manufacturing process is low and the manufacturing cost can be reduced.

In summary, in the ESD protection device of the aforementioned embodiments, the P-type barrier region has the overlapping portion overlapping the N-type drift region, and there is at least one opening in the overlapping portion. Therefore, the ESD protection device of the above embodiments can improve the uniformity of the ESD current, prevent the current crowding effect, improve the ESD robustness, and prevent the hard breakdown. In addition, the ESD protection device of the above embodiments does not cause an increase in area. On the other hand, since the manufacturing process of the ESD protection device of the above embodiments does not require the extra mask and the extra ion implantation process, the difficulty of the manufacturing process is low and the manufacturing cost can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electrostatic discharge (ESD) protection device, comprising:
   a P-type substrate;
   a first transistor comprising:
      a first gate located on the P-type substrate;
      a first N-type source region and an N-type drain region located in the P-type substrate on two sides of the first gate;
      a first P-type body region located in the P-type substrate, wherein the first P-type body region and the first N-type source region are located on the same side of the first gate, and the first N-type source region is located in the first P-type body region; and
      a first P-type bulk region located in the first P-type body region, wherein the first N-type source region is located between the first P-type bulk region and the first gate;
   a second transistor comprising:
      a second gate located on the P-type substrate;
      a second N-type source region and the N-type drain region located in the P-type substrate on two sides of the second gate, wherein the N-type drain region is located between the first gate and the second gate;
      a second P-type body region located in the P-type substrate, wherein the second P-type body region and the second N-type source region are located on the same side of the second gate, and the second N-type source region is located in the second P-type body region; and
      a second P-type bulk region located in the second P-type body region, wherein the second N-type source region is located between the second P-type bulk region and the second gate;
   an N-type drift region located in the P-type substrate between the first gate and the second gate and located directly below a portion of the first gate and directly below a portion of the second gate, wherein the N-type drain region is located in the N-type drift region; and
   a P-type barrier region located in the P-type substrate below the N-type drift region, wherein the P-type barrier region has an overlapping portion overlapping the N-type drift region, and there is at least one first opening in the overlapping portion,
   wherein there are a second opening and a third opening in the P-type barrier region,
   the second opening is located directly below the first P-type body region, and
   the third opening is located directly below the second P-type body region.

2. The ESD protection device according to claim 1, wherein the first transistor comprises a grounded-gate N-type metal oxide semiconductor (GGNMOS) transistor.

3. The ESD protection device according to claim 1, wherein the second transistor comprises a GGNMOS transistor.

4. The ESD protection device according to claim 1, wherein the first transistor and the second transistor share the N-type drain region.

5. The ESD protection device according to claim 1, wherein components in the first transistor and components in the second transistor are mirror symmetrical with respect to a plane passing through a center of the N-type drain region.

6. The ESD protection device according to claim 1, wherein the overlapping portion extends into the N-type drift region.

7. The ESD protection device according to claim 1, wherein an open ratio of the overlapping portion is 40% to 80%.

8. The ESD protection device according to claim 1, wherein an open ratio of the overlapping portion is 40% to 70%.

9. The ESD protection device according to claim 1, wherein an open ratio of the overlapping portion is 59% to 69%.

10. The ESD protection device according to claim 1, wherein a width of the overlapping portion is smaller than a width of the N-type drift region.

11. The ESD protection device according to claim 1, wherein the first transistor further comprises:
   a gate dielectric layer located between the first gate and the P-type substrate.

12. The ESD protection device according to claim 1, wherein the second transistor further comprises:
   a gate dielectric layer located between the second gate and the P-type substrate.

13. The ESD protection device according to claim 1, further comprising:
   a deep N-type well region located in the P-type substrate below the N-type drift region, the P-type barrier region, the first transistor, and the second transistor.

14. The ESD protection device according to claim 13, wherein the overlapping portion extends into the deep N-type well region.

15. The ESD protection device according to claim 13, wherein the deep N-type well region is connected to the N-type drift region.

16. The ESD protection device according to claim 1, further comprising:

an isolation structure located in the P-type substrate and defining an active region.

17. The ESD protection device according to claim 16, wherein a bottom view pattern of the P-type barrier region surrounds a bottom view pattern of the active region.

* * * * *